(12) United States Patent
Seki et al.

(10) Patent No.: US 12,114,568 B2
(45) Date of Patent: Oct. 8, 2024

(54) METHOD FOR MANUFACTURING THERMOELECTRIC CONVERSION MODULE

(71) Applicant: LINTEC CORPORATION, Tokyo (JP)

(72) Inventors: Yuta Seki, Kawasaki (JP); Kunihisa Kato, Warabi (JP); Wataru Morita, Saitama (JP); Mutsumi Masumoto, Beppu (JP)

(73) Assignee: LINTEC CORPORATION, Tokyo (JP)

( * ) Notice: Subject to any disclaimer, the term of this patent is extended or adjusted under 35 U.S.C. 154(b) by 9 days.

(21) Appl. No.: 18/034,430

(22) PCT Filed: Oct. 28, 2021

(86) PCT No.: PCT/JP2021/039751
§ 371 (c)(1),
(2) Date: Apr. 28, 2023

(87) PCT Pub. No.: WO2022/092178
PCT Pub. Date: May 5, 2022

(65) Prior Publication Data
US 2024/0023441 A1 Jan. 18, 2024

(30) Foreign Application Priority Data
Oct. 30, 2020 (JP) ................. 2020-182610

(51) Int. Cl.
*H10N 10/01* (2023.01)
*H10N 10/17* (2023.01)
*H10N 10/857* (2023.01)

(52) U.S. Cl.
CPC ............. *H10N 10/01* (2023.02); *H10N 10/17* (2023.02); *H10N 10/857* (2023.02)

(58) Field of Classification Search
CPC ...... H10N 10/01; H10N 10/17; H10N 10/857; H10N 10/856; H02N 11/00
See application file for complete search history.

(56) References Cited

U.S. PATENT DOCUMENTS

| 2016/0056360 A1 | 2/2016 | Cho et al. |
| 2018/0233648 A1* | 8/2018 | Cho ........................ H10N 10/17 |

(Continued)

FOREIGN PATENT DOCUMENTS

| JP | H09-293909 A | 11/1997 |
| JP | 2016500201 A | 1/2016 |

(Continued)

OTHER PUBLICATIONS

English machine translation of KR 2017-0019109 A (Year: 2024).*

(Continued)

*Primary Examiner* — Angelo Trivisonno
(74) *Attorney, Agent, or Firm* — Element IP, PLC (57) ABSTRACT

Provided is a method for manufacturing a thermoelectric conversion module that eliminates the need for supports and solder materials, allows collective and efficient production of a plurality of thin thermoelectric conversion modules, and includes the following steps (A) to (D): (A) disposing a chip of a P-type thermoelectric conversion material and a chip of an N-type thermoelectric conversion material on a support so as to be spaced apart from each other; (B) filling an insulator between the chip of the P-type thermoelectric conversion material and the chip of the N-type thermoelectric conversion material to obtain an integrated body including the chip of the P-type thermoelectric conversion material, the chip of the N-type thermoelectric conversion material, and the insulator; (C) peeling the integrated body obtained in step (B) from the support; and (D) connecting the chip of the P-type thermoelectric conversion material (Continued)

and the chip of the N-type thermoelectric conversion material via an electrode in the integrated body after step (C).

11 Claims, 2 Drawing Sheets

(56) References Cited

U.S. PATENT DOCUMENTS

2019/0058101 A1    2/2019   Oi et al.
2019/0378967 A1   12/2019   Morita et al.

FOREIGN PATENT DOCUMENTS

| | | | |
|---|---|---|---|
| JP | 2017059823 A | | 3/2017 |
| JP | 2019500757 A | | 1/2019 |
| KR | 20170019109 A | * | 2/2017 |
| WO | WO-2018139475 A1 | | 8/2018 |

OTHER PUBLICATIONS

International Search Report issued Jan. 25, 2022 in PCT/JP2021/039751 (with English translation), 5 pages.
Written Opinion issued Jan. 25, 2022 in PCT/JP2021/039751 (with English translation), 8 pages.

* cited by examiner

METHOD FOR MANUFACTURING THERMOELECTRIC CONVERSION MODULE

TECHNICAL FIELD

The present invention relates to a method for manufacturing a thermoelectric conversion module.

BACKGROUND ART

Typically, one means for effectively utilizing energy is a device that directly inter-converts thermal energy and electrical energy using a thermoelectric conversion module having a thermoelectric effect such as a Seebeck effect or a Peltier effect.

As such a thermoelectric conversion module, usage of a so-called π-type thermoelectric conversion element is known. The π-type thermoelectric conversion element is configured with a basic unit in which a pair of electrodes spaced apart from each other are provided on a substrate, for example, a lower surface of a P-type thermoelectric element is provided on one electrode and a lower surface of an N-type thermoelectric element is provided on the other electrode, with the lower surfaces being spaced apart from each other, and upper surfaces of both-type thermoelectric elements are connected to the electrodes on opposing substrates. A plurality of such basic units are typically provided to achieve electrically serial connection and thermally parallel connection in both substrates.

In recent years, to put a product or the like using a thermoelectric conversion module including such a n-type thermoelectric conversion element into practical use, there have been various demands for thinning of the thermoelectric conversion module, reduction in materials, improvement of productivity, improvement of reliability, and the like. For example, Patent Document 1 discloses a thermoelectric conversion module using the above-described π-type thermoelectric conversion element.

CITATION LIST

Patent Literature

Patent Document 1: JP 2017-59823 A

SUMMARY OF INVENTION

Technical Problem

However, while with the thermoelectric conversion module described in Patent Document 1, improvement of reliability of the thermoelectric conversion module, such as prevention of diffusion and generation of thermal stress as well as strong bonding of thermoelectric conversion elements and electrodes, is disclosed, the thinning of the thermoelectric conversion module, reduction in materials, improvement of productivity, and the like are not disclosed.

The present invention has been made in view of such circumstances, and an object thereof is to provide a method for manufacturing a thermoelectric conversion module that eliminates the need for supports and solder materials and allows collective and efficient production of a plurality of thin thermoelectric conversion modules.

Solution to Problem

As a result of earnest study to solve the problem described above, the inventors of the present invention have found a manufacturing method capable of collectively and efficiently obtaining a plurality of thin thermoelectric conversion modules without using a known manufacturing method for mounting chips of thermoelectric conversion materials one by one on an electrode substrate using a solder material, by preparing a self-standing integrated body with an insulator filled between a chip of a P-type thermoelectric conversion material and a chip of an N-type thermoelectric conversion material that are spaced apart from each other on a support, and then directly disposing electrodes on the chip of the P-type thermoelectric conversion material and the chip of the N-type thermoelectric conversion material on upper and lower surfaces of the integrated body peeled from the support so that a π-type thermoelectric conversion element operates, and have completed the present invention.

That is, the present invention provides the following [1] to [11].

[1] A method for manufacturing a thermoelectric conversion module, the method including the following steps (A) to (D):
  (A) disposing a chip of a P-type thermoelectric conversion material and a chip of an N-type thermoelectric conversion material on a support so as to be spaced apart from each other;
  (B) filling an insulator between the chip of the P-type thermoelectric conversion material and the chip of the N-type thermoelectric conversion material to obtain an integrated body including the chip of the P-type thermoelectric conversion material, the chip of the N-type thermoelectric conversion material, and the insulator;
  (C) peeling the integrated body obtained in step (B) from the support; and
  (D) connecting the chip of the P-type thermoelectric conversion material and the chip of the N-type thermoelectric conversion material via an electrode in the integrated body after step (C).

[2] The method for manufacturing a thermoelectric conversion module according to [1] described above, further including the following step (B') after step (B) and before step (C):
  (B') removing an excess portion of the insulator that is in direct contact with at least regions on upper surfaces of the chip of the P-type thermoelectric conversion material and the chip of the N-type thermoelectric conversion material in the integrated body obtained in step (B).

[3] The method for manufacturing a thermoelectric conversion module according to [1] or [2] described above, including the following step (E) after step (D):
  (E) laminating an insulating layer on the electrode.

[4] The method for manufacturing a thermoelectric conversion module according to [3] described above, further including the following step (F) after step (E):
  (F) laminating a thermal diffusion layer on the insulating layer.

[5] The method for manufacturing a thermoelectric conversion module according to any of [1] to [4] described above, in which the insulator is selected from an insulating resin and ceramic.

[6] The method for manufacturing a thermoelectric conversion module according to [5] described above, in which the insulating resin is selected from a polyimide-based resin, a silicone-based resin, a rubber-based resin, an acrylic resin, an olefin-based resin, a maleimide-based resin, and an epoxy-based resin.

[7] The method for manufacturing a thermoelectric conversion module according to any of [1] to [6] described above, in which a fixing layer is included between the support and the chip of the P-type thermoelectric conversion material and the chip of the N-type thermoelectric conversion material.

[8] The method for manufacturing a thermoelectric conversion module according to [7] described above, in which the fixing layer is formed from a pressure sensitive adhesive layer.

[9] The method for manufacturing a thermoelectric conversion module according to any of [1] to [8] described above, in which the support is selected from glass, plastic, and silicon.

[10] The method for manufacturing a thermoelectric conversion module according to any of [1] to [9] described above, in which the chip of the P-type thermoelectric conversion material and the chip of the N-type thermoelectric conversion material are formed from a thermoelectric semiconductor composition.

[11] The method for manufacturing a thermoelectric conversion module according to [10] described above, in which the thermoelectric semiconductor composition includes a thermoelectric semiconductor material, a heat-resistant resin, and one or both of an ionic liquid and an inorganic ionic compound.

Advantageous Effects of Invention

The present invention can provide a method for manufacturing a thermoelectric conversion module that eliminates the need for supports and solder materials and allows collective and efficient production of a plurality of thin thermoelectric conversion modules.

DESCRIPTION OF EMBODIMENTS

Method for Manufacturing Thermoelectric Conversion Module

A method for manufacturing a thermoelectric conversion module according to the present invention includes the following steps (A) to (D):

(A) disposing a chip of a P-type thermoelectric conversion material and a chip of an N-type thermoelectric conversion material on a support so as to be spaced apart from each other;

(B) filling an insulator between the chip of the P-type thermoelectric conversion material and the chip of the N-type thermoelectric conversion material to obtain an integrated body including the chip of the P-type thermoelectric conversion material, the chip of the N-type thermoelectric conversion material, and the insulator;

(C) peeling the integrated body obtained in step (B) from the support; and (D) connecting the chip of the P-type thermoelectric conversion material and the chip of the N-type thermoelectric conversion material via an electrode in the integrated body after step (C).

The method for manufacturing a thermoelectric conversion module according to the present invention can collectively and efficiently produce a plurality of thin thermoelectric conversion modules that eliminate the need for solder materials and supports used in known methods, by, for example, preparing a self-standing integrated body including a chip of a P-type thermoelectric conversion material, a chip of an N-type thermoelectric conversion material, and an insulator with the chip of the P-type thermoelectric conversion material and the chip of the N-type thermoelectric conversion material alternately arranged and spaced apart from each other on a support, and with the insulator filled between the chip of the P-type thermoelectric conversion material and the chip of the N-type thermoelectric conversion material, and forming an electrode directly on the integrated body from which the support has been peeled.

In the following description, steps (A), (B), (C), and (D) may be referred to as "(A) thermoelectric conversion material chip disposing step or step (A)", "(B) insulator filling step or step (B)", "(C) support peeling step or step (C)", and "(D) electrode forming step or step (D)", in this order. Steps (B'), (E), and (F) may be referred to as "(B') insulator excess portion removing step or step (B')", "(E) insulating layer forming step or step (E)", and "(F) thermal diffusion layer forming step", in this order. Furthermore, "a chip of a P-type thermoelectric conversion material and a chip of an N-type thermoelectric conversion material" may be simply referred to as "chips of thermoelectric conversion materials".

In the present specification, the "excess portion of the insulator" or the "insulator excess portion" means a layer of the insulator extending to regions on the upper surfaces of the chip of the P-type thermoelectric conversion material and the chip of the N-type thermoelectric conversion material when the insulator is filled between the chip of the P-type thermoelectric conversion material and the chip of the N-type thermoelectric conversion material in step (B).

Figure 1:
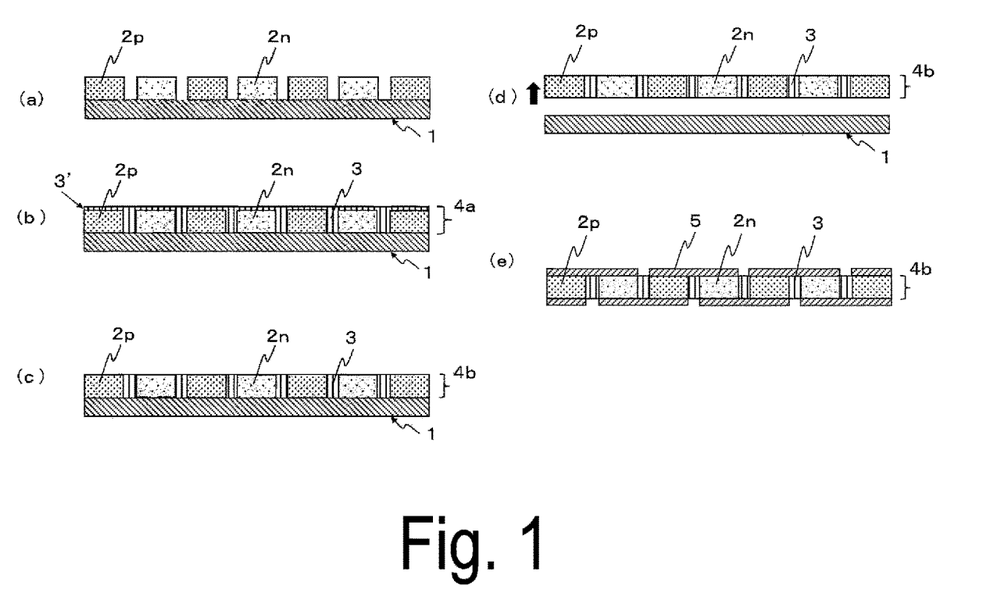
FIG. 1 is an explanatory view illustrating an example of steps of a method for manufacturing a thermoelectric conversion module according to the present invention in an order of the steps.

FIG. 1 is an explanatory view illustrating an example of steps of the method for manufacturing a thermoelectric conversion module according to the present invention in an order of the steps, in which (a) is a cross-sectional view illustrating an aspect after a chip 2p of a P-type thermoelectric conversion material and a chip 2n of an N-type thermoelectric conversion material are disposed on a support 1 so as to be spaced apart from each other, (b) is a cross-sectional view illustrating an aspect after an insulator 3 is filled between the chip 2p of the P-type thermoelectric conversion material and the chip 2n of the N-type thermoelectric conversion material to form an integrated body 4a including the chip 2p of the P-type thermoelectric conversion material, the chip 2n of the N-type thermoelectric conversion material, and the insulator 3, (c) is a cross-sectional view illustrating an aspect after an insulator excess portion 3' overcoated on and between the chip 2p of the P-type thermoelectric conversion material and the chip 2n of the N-type thermoelectric conversion material in (b) is removed to form an integrated body 4b, and (d) is a cross-sectional view illustrating an aspect after the obtained integrated body 4b is peeled from the support 1.

(e) is a cross-sectional view illustrating an aspect after electrodes 5 are formed on upper and lower surfaces of the chip 2p of the P-type thermoelectric conversion material and the chip 2n of the N-type thermoelectric conversion material in the integrated body 4b so as to constitute a π-type thermoelectric conversion element, and this configuration is a basic configuration (first embodiment) of the thermoelectric conversion module according to the present invention.

Figure 2:
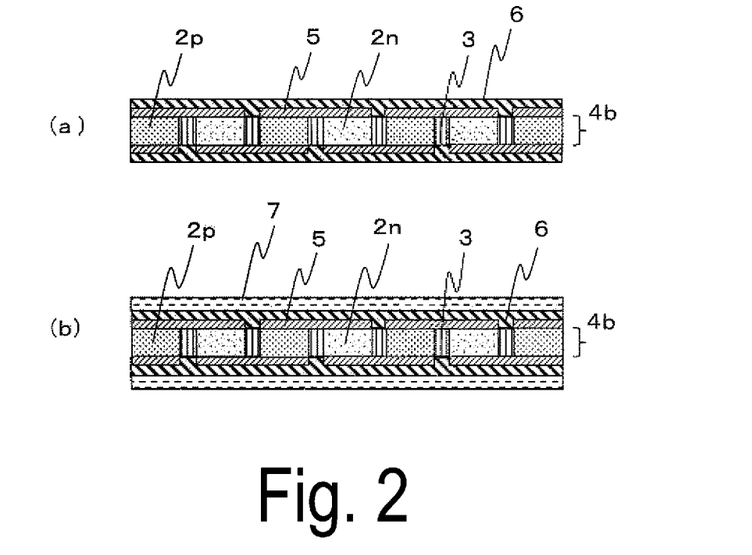
FIG. 2 is a cross-sectional configuration diagram illustrating embodiments of the thermoelectric conversion module according to the present invention.

FIG. 2 is a cross-sectional configuration diagram illustrating embodiments of the thermoelectric conversion module according to the present invention, in which (a) is a cross-sectional view (second embodiment) illustrating an aspect after insulating layers 6 are formed on upper and lower surfaces of the electrodes 5 in the basic configuration obtained in (e) of FIG. 1, and (b) is a cross-sectional view (third embodiment) illustrating an aspect after thermal diffusion layers 7 are formed on upper and lower surfaces of the insulating layers 6 in the configuration obtained in (a) described above.

(A) Thermoelectric Conversion Material Chip Disposing Step

The method for manufacturing a thermoelectric conversion module according to the present invention includes a thermoelectric conversion material chip disposing step.

The thermoelectric conversion material chip disposing step is a step of disposing a chip of a P-type thermoelectric conversion material and a chip of an N-type thermoelectric conversion material on a support so as to be spaced apart from each other, and is, for example, a step of disposing chips 2p of the P-type thermoelectric conversion material and chips 2n of the N-type thermoelectric conversion material on the support 1 so as to be alternately arranged and spaced apart from each other in (a) of FIG. 1 described above.

The method for disposing the chip of the P-type thermoelectric conversion material and the chip of the N-type thermoelectric conversion material so as to be spaced apart from each other is not particularly limited. For example, a chip of the P-type thermoelectric conversion material and a chip of the N-type thermoelectric conversion material prepared in advance may be individually disposed on a fixing layer described below so as to be spaced apart from each other, chips of the P-type thermoelectric conversion material and chips of the N-type thermoelectric conversion material that are spaced apart from each other and alternately arrayed may be bonded onto a support with a pressure sensitive adhesive layer as a fixing layer described below interposed therebetween, or chips of the P-type thermoelectric conversion material and chips of the N-type thermoelectric conversion material may be directly formed on a support so as to be alternately arranged and spaced apart from each other.

As a method for directly forming the chips of the P-type thermoelectric conversion material and the chips of the N-type thermoelectric conversion material, screen printing or application by a dispenser or the like can be performed.

The chip of the thermoelectric conversion material used in the present invention is not particularly limited, and may be formed from a thermoelectric semiconductor material or may be a thin film formed from a thermoelectric semiconductor composition.

From the perspectives of flexibility, thin profile, and thermoelectric performance, the chip is preferably formed from a thin film formed from a thermoelectric semiconductor composition containing a thermoelectric semiconductor material (hereinafter, also referred to as "thermoelectric semiconductor particles"), a resin, and one or both of an ionic liquid and an inorganic ionic compound.

In the present specification, "thermoelectric conversion material" is synonymous with "chip of a thermoelectric conversion material" and with "thermoelectric conversion material layer (including a layer having a gap)".

Thermoelectric Semiconductor Material

The thermoelectric semiconductor material used in the chip of the thermoelectric conversion material is, for example, preferably pulverized to a predetermined size by a micropulverizer or the like and used as thermoelectric semiconductor particles (hereinafter, the thermoelectric semiconductor material may be referred to as "thermoelectric semiconductor particles").

A particle size of the thermoelectric semiconductor particles is preferably from 10 nm to 100 μm, more preferably from 20 nm to 50 μm, and even more preferably from 30 to 30 μm.

An average particle size of the thermoelectric semiconductor particles was obtained by measurement using a laser diffraction particle size analyzer (Mastersizer 3000 available from Malvern Panalytical Ltd.), and used as the median of the particle size distribution.

In the chip of the thermoelectric conversion material used in the present invention, the thermoelectric semiconductor material constituting the chip of the P-type thermoelectric conversion material and the chip of the N-type conversion material is not particularly limited as long as the material is capable of generating a thermo-electromotive force by imparting a temperature difference. Examples of such thermoelectric semiconductor materials that can be used include bismuth-tellurium-based thermoelectric semiconductor materials such as a P-type bismuth telluride, and an N-type bismuth telluride; telluride-based thermoelectric semiconductor materials such as GeTe and PbTe; antimony-tellurium-based thermoelectric semiconductor materials; zinc-antimony-based thermoelectric semiconductor materials such as ZnSb, $Zn_3Sb_2$, and $Zn_4Sb_3$; silicon-germanium-based thermoelectric semiconductor materials such as SiGe; bismuth selenide-based thermoelectric semiconductor materials such as $Bi_2Se_3$; silicide-based thermoelectric semiconductor materials such as β-$FeSi_2$, $CrSi_2$, $MnSi_{1.73}$, and $Mg_2Si$; oxide-based thermoelectric semiconductor materials; Heusler materials such as FeVAl, FeVAlSi, and FeVTiAl; and sulfide-based thermoelectric semiconductor materials such as $TiS_2$.

Among these materials, the thermoelectric semiconductor material used in the present invention is preferably a bismuth-tellurium-based thermoelectric semiconductor materials such as P-type bismuth telluride or N-type bismuth telluride.

The P-type bismuth telluride is preferably one for which the carrier is a positive hole and the Seebeck coefficient is a positive value, and for example, a P-type bismuth telluride represented by $Bi_XTe_3Sb_{2-X}$ is preferably used. In this case, X is preferably 0<X≤0.8, and more preferably 0.4≤X≤0.6. X of greater than 0 and 0.8 or less is preferred because the Seebeck coefficient and electrical conductivity become large, and characteristics as the P-type thermoelectric conversion material are maintained.

In addition, the N-type bismuth telluride is preferably one for which the carrier is an electron and the Seebeck coefficient is a negative value, and, for example, an N-type bismuth telluride represented by $Bi_2Te_{3-Y}Se_Y$ is preferably used. In this case, Y is preferably 0≤Y≤3 (when Y=0, $Bi_2Te_3$), and more preferably 0.1<Y≤2.7. Y of 0 or greater and 3 or less is preferred because the Seebeck coefficient and electrical conductivity become large, and characteristics as the N-type thermoelectric conversion material are maintained.

The content of the thermoelectric semiconductor particles in the thermoelectric semiconductor composition is preferably from 30 to 99 mass %. More preferably, the content is from 50 to 96 mass %, and even more preferably from 70 to 95 mass %. If the content of the thermoelectric semiconductor particles is within the range described above, the Seebeck coefficient (absolute value of the Peltier coefficient)

is large, a decrease in electrical conductivity is suppressed, and only thermal conductivity is reduced, and therefore a film exhibiting a high thermoelectric performance and having sufficient film strength and flexibility is obtained. Thus, the content of the thermoelectric semiconductor particles is preferably within the range described above.

Furthermore, the thermoelectric semiconductor particles are preferably subjected to an annealing treatment (hereinafter, also referred to as an "annealing treatment A"). When the thermoelectric semiconductor particles are subjected to the annealing treatment A, the crystallinity of the thermoelectric semiconductor particles is improved, and a surface oxide film of the thermoelectric semiconductor particles is removed, and therefore the Seebeck coefficient (absolute value of the Peltier coefficient) of the thermoelectric conversion material increases, and the thermoelectric performance index can be further improved.

Resin

The resin used in the present invention has a function of physically bonding the thermoelectric semiconductor material (thermoelectric semiconductor particles) together, and can increase the flexibility of the thermoelectric conversion module and facilitate the formation of a thin film through coating or the like.

The resin is preferably a heat-resistant resin or a binder resin.

When crystal growth of the thermoelectric semiconductor particles is caused by subjecting the thin film formed from the thermoelectric semiconductor composition to an annealing treatment or the like, the physical properties such as mechanical strength and thermal conductivity of the heat-resistant resin as a resin are maintained without being impaired.

From the perspective of further increasing heat resistance and not adversely affecting crystal growth of the thermoelectric semiconductor particles in the thin film, the heat-resistant resin is preferably a polyamide resin, a polyamide-imide resin, a polyimide resin, or an epoxy resin, and from the perspective of excelling in flexibility, the heat-resistant resin is more preferably a polyamide resin, a polyamide-imide resin, or a polyimide resin.

The heat-resistant resin preferably has a decomposition temperature of 300° C. or higher. If the decomposition temperature is within the range described above, flexibility can be maintained without loss of function as a binder even when the thin film formed from the thermoelectric semiconductor composition is subjected to annealing treatment as described below.

In addition, the heat-resistant resin preferably has a mass loss rate at 300° C. of not greater than 10%, more preferably not greater than 5%, and even more preferably not greater than 1%, as measured through thermogravimetry (TG). If the mass loss rate is within the range described above, even if the thin film made from the thermoelectric semiconductor composition is subjected to annealing treatment, flexibility of the chip of the thermoelectric conversion material can be maintained without loss of function as a binder.

The content of the heat-resistant resin in the thermoelectric semiconductor composition is from 0.1 to 40 mass %, preferably from 0.5 to 20 mass %, more preferably from 1 to 20 mass %, and even more preferably from 2 to 15 mass %. When the content of the heat-resistant resin is within the range described above, the heat-resistant resin functions as a binder of the thermoelectric semiconductor material and facilitates the formation of a thin film, a film having both high thermoelectric performance and film strength is obtained, and a resin portion is present on an outer surface of the chip of the thermoelectric conversion material.

The binder resin also facilitates peeling from a base material of glass, alumina, silicon, or the like after a firing (annealing) treatment (corresponding to the "annealing treatment B" described below, same hereinafter), the base material being used when fabricating a chip of a thermoelectric conversion material.

The binder resin is preferably a resin for which 90 mass % or more decomposes at the firing (annealing) temperature or higher, is more preferably a resin for which 95 mass % or more decomposes at the firing temperature or higher, and is particularly preferably a resin for which 99 mass % or more decomposes at the firing temperature or higher. In addition, the binder resin is more preferably a resin of which various physical properties such as mechanical strength and thermal conductivity are maintained without being impaired when crystal growth of the thermoelectric semiconductor particles is caused by subjecting a coating film (thin film) including the thermoelectric semiconductor composition to a firing (annealing) treatment or the like.

When a resin for which 90 mass % or more decomposes at the firing (annealing) temperature or higher, that is, a resin that decomposes at a lower temperature than the heat-resistant resin described above, is used as the binder resin, the binder resin decomposes through firing, and therefore the content of the binder resin serving as an insulating component contained in the fired product is reduced, and crystal growth of the thermoelectric semiconductor particles in the thermoelectric semiconductor composition is promoted. Thus, voids in the thermoelectric conversion material layer can be reduced, and the filling ratio can be improved.

Note that whether a resin decomposes at or above a predetermined amount (for example, 90 mass %) at or above the firing (annealing) temperature is determined by measuring the mass loss rate (a value obtained by dividing the mass after decomposition by the mass before decomposition) at the firing (annealing) temperature through thermogravimetry (TG).

A thermoplastic resin or a curable resin can be used as the binder resin. Examples of thermoplastic resins include polyolefin resins such as polyethylene, polypropylene, polyisobutylene, and polymethylpentene; polycarbonates; thermoplastic polyester resins such as polyethylene terephthalate and polyethylene naphthalate; polyvinyl polymers such as polystyrene, acrylonitrile-styrene copolymers, poly(vinylacetate), ethylene-vinyl acetate copolymers, vinyl chloride, poly(vinyl pyridine), poly(vinyl alcohol), and poly(vinyl pyrrolidone); polyurethanes; and cellulose derivatives such as ethyl cellulose. Examples of the curable resin include thermosetting resins and photocurable resins. Examples of thermosetting resins include epoxy resins and phenol resins. Examples of photocurable resins include photocurable acrylic resins, photocurable urethane resins, and photocurable epoxy resins. One of these may be used alone, or two or more may be used in combination.

Among these, from the perspective of electrical resistivity of the thermoelectric conversion material in the thermoelectric conversion material layer, a thermoplastic resin is preferable, a polycarbonate or a cellulose derivative such as ethyl cellulose is more preferable, and a polycarbonate is particularly preferable.

The binder resin is appropriately selected according to the temperature of the firing (annealing) treatment of the thermoelectric semiconductor material in the firing (annealing) treatment process. From the perspective of electrical resistivity of the thermoelectric conversion material in the thermoelectric conversion material layer, the firing (annealing) treatment is preferably implemented at a temperature equal to or higher than the final decomposition temperature of the binder resin.

In the present specification, the "final decomposition temperature" refers to a temperature at which the mass loss rate at the firing (annealing) temperature as determined through thermogravimetry (TG) is 100% (mass after decomposition is 0% of the mass before decomposition).

The final decomposition temperature of the binder resin is typically from 150 to 600° C., preferably from 200 to 560° C., more preferably from 220 to 460° C., and particularly preferably from 240 to 360° C. When a binder resin having a final decomposition temperature within this range is used, the binder resin functions as a binder for the thermoelectric semiconductor material, and formation of a thin film is facilitated when printing.

The content of the binder resin in the thermoelectric semiconductor composition is from 0.1 to 40 mass %, preferably from 0.5 to 20 mass %, more preferably from 0.5 to mass %, and particularly preferably from 0.5 to 5 mass %. When the content of the binder resin is within the range described above, the electrical resistivity of the thermoelectric conversion material in the thermoelectric conversion material layer can be reduced.

The content of the binder resin in the thermoelectric conversion material is preferably from 0 to 10 mass %, more preferably from 0 to 5 mass %, and particularly preferably from 0 to 1 mass %. If the content of the binder resin in the thermoelectric conversion material is within the range described above, the electrical resistivity of the thermoelectric conversion material in the thermoelectric conversion material layer can be reduced.

Ionic Liquid

The ionic liquid that may be contained in the thermoelectric semiconductor composition is a molten salt obtained by combining a cation and an anion and means a salt that can be present as a liquid in any temperature region in −50° C. or higher and lower than 400° C. In other words, the ionic liquid is an ionic compound having a melting point in the range of −50° C. or higher and lower than 400° C. The melting point of the ionic liquid is preferably −25° C. or higher and 200° C. or lower, and more preferably 0° C. or higher and 150° C. or lower. Because the ionic liquid has characteristics such as having a significantly low vapor pressure and being nonvolatile, having excellent thermal stability and electrochemical stability, having a low viscosity, and having a high ionic conductivity, the ionic liquid can effectively suppress reduction of the electrical conductivity between the thermoelectric semiconductor materials as a conductivity aid. Furthermore, because the ionic liquid exhibits high polarity based on the aprotic ionic structure and excellent compatibility with the heat-resistant resin is achieved, the electrical conductivity of the thermoelectric conversion material can be made uniform.

As the ionic liquid, a known or commercially available ionic liquid can be used. Examples thereof include those formed from nitrogen-containing cyclic cation compounds and derivatives thereof, such as pyridinium, pyrimidinium, pyrazolium, pyrrolidinium, piperidinium, and imidazolium; tetraalkylammonium-based amine cations and derivatives thereof; phosphine cations and derivatives thereof, such as phosphonium, trialkylsulfonium, and tetraalkylphosphonium; cation components, such as lithium cation and derivatives thereof; and anion components, such as $Cl^-$, $Br^-$, $I^-$, $AlCl_4^-$, $Al_2O_7^-$, $BF_4^-$, $PF_6^-$, $ClO_4^-$, $NO_3^-$, $CH_3COO^-$, $CF_3COO^-$, $CH_3SO_3^-$, $CF_3SO_3^-$, $(FSO_2)_2N^-$, $(CF_3SO_2)_2N^-$, $(CF_3SO_2)_3C^-$, $AsF_6^-$, $SbF_6^-$, $NbF_6^-$, $TaF_6^-$, $F(HF)_n^-$, $(CN)_2N^-$, $C_4F_9SO_3^-$, $(C_2F_5SO_2)_2N^-$, $C_3F_7COO^-$, and $(CF_3SO_2)(CF_3CO)N^-$.

In the ionic liquid described above, from the perspective of high temperature stability, compatibility between the thermoelectric semiconductor material and the resin, suppression of reduction of the electrical conductivity between the thermoelectric semiconductor materials, and the like, the cation component of the ionic liquid preferably contains at least one type selected from the group consisting of pyridinium cations and derivatives thereof and imidazolium cations and derivatives thereof.

In ionic liquids containing pyridinium cations and derivatives thereof, the cation component is preferably 1-butyl-4-methylpyridinium bromide, 1-butylpyridinium bromide, or 1-butyl-4-methylpyridinium hexafluorophosphate.

In ionic liquids containing imidazolium cations and derivatives thereof, the cation component is preferably [1-butyl-3-(2-hydroxyethyl)imidazolium bromide] or [1-butyl-3-(2-hydroxyethyl)imidazolium tetrafluoroborate].

Furthermore, the ionic liquid described above preferably has a decomposition temperature of 300° C. or higher. When the decomposition temperature is in the range described above, as described below, even in a case where a thin film formed from the thermoelectric semiconductor composition is subjected to annealing treatment, effect as the conductivity aid can be maintained.

The content of the ionic liquid in the thermoelectric semiconductor composition is preferably from 0.01 to 50 mass %, more preferably from 0.5 to 30 mass %, and even more preferably from 1.0 to 20 mass %. When the content of the ionic liquid is in the range described above, reduction of the electrical conductivity is effectively suppressed, and a film having a high thermoelectric performance can be obtained.

Inorganic Ionic Compound

The inorganic ionic compound that may be contained in the thermoelectric semiconductor composition is a compound formed from at least a cation and an anion.

Because the inorganic ionic compound is present as a solid in a wide range of a temperature region, which is from 400 to 900° C., and has characteristics such as high ionic conductivity, the inorganic ionic compound can suppress reduction of the electrical conductivity between the thermoelectric semiconductor materials as a conductivity aid.

The content of the inorganic ionic compound in the thermoelectric semiconductor composition is preferably from 0.01 to 50 mass %, more preferably from to 30 mass %, and even more preferably from 1.0 to 10 mass %. When the content of the inorganic ionic compound is in the range described above, reduction of the electrical conductivity is effectively suppressed and, as a result, a film having an improved thermoelectric performance can be obtained.

Note that when the inorganic ionic compound and the ionic liquid are used in combination, the total amount of the content of the inorganic ionic compound and the ionic liquid in the thermoelectric semiconductor composition is preferably from 0.01 to mass %, more preferably from 0.5 to 30 mass %, and even more preferably from 1.0 to mass %.

The method for coating the P-type and N-type thermoelectric semiconductor compositions onto a support is not particularly limited, and examples include well-known methods such as screen printing, flexographic printing, gravure printing, spin coating, dip coating, die coating, spray coating, bar coating, and doctor blade coating. When the coating is to be formed in a pattern, a method such as screen printing, stencil printing, or slot die coating by which the pattern can be easily formed using a screen plate having the desired pattern is preferably used.

Next, the obtained coating is dried, and thereby a thin film is formed. As the drying method, a well-known drying method can be used, such as hot air drying, heated roll drying, and infrared irradiation. The heating temperature is typically from 80 to 150° C., and while the heating time differs depending on the heating method, the heating time is typically from tens of seconds to tens of minutes.

Furthermore, when a solvent is used in the preparation of the thermoelectric semiconductor composition, the heating temperature is not particularly limited as long as the temperature is within a temperature range in which the solvent that is used can be dried.

A thickness of each of the chips of the thermoelectric conversion materials is not particularly limited, but, from the perspective of thermoelectric performance and film strength, is preferably from 100 nm to 1000 µm, more preferably from 300 nm to 600 µm, and even more preferably from 5 to 400 µm.

The chip of the P-type thermoelectric conversion material and the chip of the N-type thermoelectric conversion material formed from the thermoelectric semiconductor compositions are preferably further subjected to an annealing treatment (also referred to hereinafter as the "annealing treatment B"). By subjecting the chips to the annealing treatment B, the thermoelectric performance can be stabilized, crystal growth of the thermoelectric semiconductor particles in the chips of the thermoelectric conversion materials can be promoted, and the thermoelectric performance can be further improved. The annealing treatment B is not particularly limited, but is ordinarily implemented in an atmosphere with the gas flow rate controlled, including in an inert gas atmosphere such as nitrogen or argon or in a reducing gas atmosphere, or is implemented under vacuum conditions, and while dependent on factors such as the heat resistance temperatures of the thermoelectric semiconductor compositions, the support, and the like that are used, the annealing treatment B is implemented at a temperature of from 100 to 500° C. for several minutes to several tens of hours.

Support

The support used in the present invention is not particularly limited, and examples thereof include glass, silicon, ceramic, metals, and plastics. Among these, glass, plastic, and silicon are preferably selected. When annealing treatment or the like is performed at a high temperature, glass, silicon, ceramic, and metals are preferable.

The thickness of the support is preferably from 100 to 1200 µm, more preferably from 200 to 800 µm, and even more preferably from 400 to 700 µm from the perspectives of process and dimensional stability.

Fixing Layer

A fixing layer is preferably included between the support and the chip of the P-type thermoelectric conversion material and the chip of the N-type thermoelectric conversion material. The fixing layer is used for fixing the support and the chips of the thermoelectric conversion materials when the chips of the thermoelectric conversion materials are disposed so as to be spaced apart from each other in step (A). The fixing layer is not particularly limited as long as the fixing layer can cause the support and the chips of the thermoelectric conversion materials to adhere to each other. In one aspect, a pressure sensitive adhesive layer is preferably used. A pressure sensitive adhesive layer containing an energy ray-curable pressure sensitive adhesive resin in which polymerizable functional groups are introduced into side chains is preferably used from the perspectives of adhesiveness and reduction in adhesive strength by curing with an energy ray such as an ultraviolet ray.

The pressure sensitive adhesive layer may be any layer containing a pressure sensitive adhesive resin, and may contain additives for pressure sensitive adhesives such as a cross-linking agent, a tackifier, a polymerizable compound, and a polymerization initiator as necessary.

The pressure sensitive adhesive layer may be formed from a pressure sensitive adhesive composition containing a pressure sensitive adhesive resin by a well-known method. For example, the pressure sensitive adhesive layer can be formed by a coating method.

Examples of the pressure sensitive adhesive resin include acrylic resins, urethane-based resins, polyisobutylene-based resins and other rubber-based resins, polyester-based resins, olefin-based resins, silicone-based resins, and polyvinyl ether-based resins.

The thickness of the pressure sensitive adhesive layer is not particularly limited, but is preferably from about 1 to 50 µm, more preferably from 2 to 30 µm.

(B) Insulator Filling Step

The method for manufacturing a thermoelectric conversion module according to the present invention includes an insulator filling step.

The insulator filling step is a step of filling an insulator between the chip of the P-type thermoelectric conversion material and the chip of the N-type thermoelectric conversion material to obtain an integrated body including the chip of the P-type thermoelectric conversion material, the chip of the N-type thermoelectric conversion material, and the insulator, and is, for example, a step of filling the insulator 3 between the chip 2$p$ of the P-type thermoelectric conversion material and the chip 2$n$ of the N-type thermoelectric conversion material in (b) of FIG. 1 to obtain the self-standing integrated body 4$a$ including the chip 2$p$ of the P-type thermoelectric conversion material, the chip 2$n$ of the N-type thermoelectric conversion material, and the insulator 3.

Insulator

The insulator used in the present invention is not particularly limited as long as the insulating property between the chip of the P-type thermoelectric conversion material and the chip of the N-type thermoelectric conversion material and the mechanical strength of them formed into an integrated body can be maintained, and examples thereof include an insulating resin and ceramic.

Examples of the insulating resin include a polyimide-based resin, a silicone-based resin, a rubber-based resin, an acrylic resin, an olefin-based resin, a maleimide-based resin, and an epoxy-based resin. From the perspectives of heat resistance and mechanical strength, the resin is preferably selected from a polyimide-based resin, a silicone-based resin, an acrylic resin, a maleimide-based resin, and an epoxy-based resin. The insulating resin is preferably a curable resin or a foamable resin.

The insulating resin may further include a filler. The filler is preferably a hollow filler. The hollow filler is not particularly limited, and a known hollow filler can be used. Examples thereof include inorganic hollow fillers such as glass balloon, silica balloon, shirasu balloon, fly ash balloon, and metal silicate balloon (hollow body), and organic resin hollow fillers such as acrylonitrile, vinylidene chloride, phenol resin, epoxy resin, and urea resin balloon (hollow body). By using the hollow filler, the thermal conductivity of the insulating resin is lowered and the thermoelectric performance is further improved.

Examples of the ceramic include materials containing aluminum oxide (alumina), aluminum nitride, zirconium oxide (zirconia), silicon carbide, or the like as a main component (50 mass % or more in the ceramic). In addition to the main component, for example, a rare earth compound can be added.

The insulator can be filled by a well-known method. Examples of the method include: as examples of using a liquid resin, a method in which the resin is applied over and filled in a support surface on which chips of the P-type thermoelectric conversion material and chips of the N-type thermoelectric conversion material are alternately arranged using a coating member such as a squeegee, a method in which the resin is dropped from substantially the center to the outer side of the support and then filled by spin coating, and a method in which the support is immersed in a liquid resin reservoir or the like and then pulled up to fill the resin; and as an example using a sheet insulating resin, a method in which the sheet insulating resin is applied onto a support surface on which chips of the P-type thermoelectric conversion material and chips of the N-type thermoelectric conversion material are alternately arranged and the sheet insulating resin is melted and filled by heating and/or pressurization. After filling the insulator, thermal curing or the like is performed.

(B') Insulator Excess Portion Removing Step

The method for manufacturing a thermoelectric conversion module according to the present invention preferably includes an insulator excess portion removing step. The insulator excess portion removing step is a step, after step (B) and before step (C), of removing an excess portion of the insulator that is in direct contact with at least regions on upper surfaces of the chip of the P-type thermoelectric conversion material and the chip of the N-type thermoelectric conversion material in the integrated body obtained in step (B). In this step, in the remaining insulator present in the region between the chip of the P-type thermoelectric conversion material and the chip of the N-type thermoelectric conversion material, an insulator excessively extending in the thickness direction may be further removed. For example, this is a step of removing an insulator excess portion 3' positioned above the insulator 3, in the integrated body 4a in (b) of FIG. 1, including a region on the upper surface of the chip 2p of the P-type thermoelectric conversion material, the upper surface of the chip 2n of the N-type thermoelectric conversion material, and between the chip 2p of the P-type thermoelectric conversion material and the chip 2n of the N-type thermoelectric conversion material, resulting in an aspect of the integrated body 4b in (c) of FIG. 1.

The insulator excess portion can be removed by a well-known method. For example, the insulator excess portion 3' positioned above the insulator 3 in a region on the chip 2p of the P-type thermoelectric conversion material, the chip 2n of the N-type thermoelectric conversion material, and between the chip 2p of the P-type thermoelectric conversion material and the chip 2n of the N-type thermoelectric conversion material may be irradiated with plasma or the like or mechanically polished or the like to remove the insulator excess portion 3' to expose the upper surfaces of the chip 2p of the P-type thermoelectric conversion material and the chip 2n of the N-type thermoelectric conversion material. By performing such a treatment, the electrical bonding property between the electrodes obtained in step (D) described below and the chips of the thermoelectric conversion materials is improved.

(C) Support Peeling Step

The method for manufacturing a thermoelectric conversion module according to the present invention includes a support peeling step.

The support peeling step is a step of peeling the integrated body obtained in step (B) (or step (B')) from the support, and is, for example, a step of peeling the integrated body 4b from the support 1 in (d) of FIG. 1.

The support can be peeled by a well-known method. For example, when the support is fixed to the chips of the thermoelectric conversion materials constituting the integrated body with a pressure sensitive adhesive layer interposed therebetween, the pressure sensitive adhesion property of the pressure sensitive adhesive layer is deactivated and the integrated body is peeled from the support, and then the residue and the like of the pressure sensitive adhesive layer are removed by acid washing or the like. Alternatively, the support itself is directly polished until lower surface portions of the chips of the thermoelectric conversion materials are exposed to obtain the integrated body as a single body.

(D) Electrode Forming Step

The method for manufacturing a thermoelectric conversion module according to the present invention includes an electrode forming step.

The electrode forming step is a step of directly disposing (forming) electrodes on the chip of the P-type thermoelectric conversion material and the chip of the N-type thermoelectric conversion material on the upper and lower surfaces in the integrated body after step (C) and connecting the chip of the P-type thermoelectric conversion material and the chip of the N-type thermoelectric conversion material via the electrodes, and is, for example, a step of directly forming and disposing the electrodes on the chip 2p of the P-type thermoelectric conversion material and the chip 2n of the N-type thermoelectric conversion material on the upper and lower surfaces of the integrated body 4b in (e) of FIG. 1 so that a π-type thermoelectric conversion element operates.

Electrodes

Examples of the metal materials of the electrodes of the thermoelectric conversion module used in the present invention include copper, gold, nickel, aluminum, rhodium, platinum, chromium, palladium, stainless steel, molybdenum, solder, or alloys containing any of these metals.

The thicknesses of the respective layers of the electrodes are preferably from 10 nm to 200 μm, more preferably from 30 nm to 150 μm, and even more preferably from nm to 120 μm. If the thicknesses of the respective layers of the electrodes are within the range described above, electrical conductivity is high, resistance is low, and sufficient strength of an electrode is obtained.

The electrodes are formed using the above-described metal materials.

A method for forming the electrodes is, for example, a method in which an electrode having no pattern formed thereon is provided on the support, and processed into a predetermined pattern shape by a well-known physical treatment or chemical treatment mainly using a photolithography method, or a method in which a pattern of an electrode is directly formed by screen printing, an inkjet method, or the like.

Examples of methods for forming an electrode having no pattern formed thereon include dry processes including physical vapor deposition (PVD) methods, such as vacuum vapor deposition, sputtering, and ion plating or chemical vapor deposition (CVD) methods, such as thermal CVD and atomic layer deposition (ALD); or wet processes including various coating methods, such as dip coating, spin coating, spray coating, gravure coating, die coating, and doctor blade coating, and electrodeposition methods; silver salt methods; electrolytic plating; electroless plating; and lamination of metal foils. The method is appropriately selected according to the material for the electrode.

From the perspective of maintaining thermoelectric performance, the electrodes used in the present invention are required to exhibit high electrical conductivity and high thermal conductivity, and therefore use of electrodes formed by a plating method or a vacuum film formation method is preferable. Since high electrical conductivity and high thermal conductivity can be easily achieved, vacuum film formation methods such as vacuum vapor deposition and sputtering, electrolytic plating; and electroless plating are preferred. A pattern can be easily formed through a hard mask such as a metal mask depending on the dimensions of the pattern to be formed and the required dimensional accuracy.

The thicknesses of the layers of the metal materials are preferably from 10 nm to 200 μm, more preferably from 30 nm to 150 μm, and even more preferably from 50 nm to 120 μm. If the thicknesses of the layers of the metal materials are within the range described above, electrical conductivity is high, resistance is low, and sufficient strength for the electrodes is obtained.

(E) Insulating Layer Forming Step

The method for manufacturing a thermoelectric conversion module according to the present invention preferably includes an insulating layer forming step. The insulating layer forming step is a step of laminating insulating layers on the upper and lower surfaces of the electrodes obtained in step (D), and is, for example, a step of forming the insulating layers 6 on the upper and lower surfaces of the electrode 5 in (a) of FIG. 2 described above.

The insulating layers are not particularly limited. For example, the insulating layers are provided on the electrodes to suppress short circuiting between the chips of the thermoelectric conversion materials and a conductive portion of thermal diffusion layers described below and/or short circuiting between the chips of the thermoelectric conversion materials and a conductive portion or the like on a mounting surface of the thermoelectric conversion module.

The insulating layers are not particularly limited as long as the insulating layers have insulating properties, and preferably include resins for forming insulating layers or inorganic materials, with resins for forming insulating layers being more preferable from the perspective of flexibility.

Examples of the resins for forming insulating layers include polyimide, polyamide, polyamide-imide, polyphenylene ether, polyether ketone, polyether ether ketone, polyolefin, polyester, polycarbonate, polysulfone, polyethersulfone, polyphenylene sulfide, polyarylate, nylon, acrylic resin, cycloolefin polymer, and aromatic polymer.

Among these, examples of the polyester include polyethylene terephthalate (PET), polybutylene terephthalate, polyethylene naphthalate (PEN), and polyarylate. Examples of the cycloolefin polymer include a norbornene-based polymer, a monocyclic olefin-based polymer, a cyclic conjugated diene-based polymer, a vinyl alicyclic hydrocarbon polymer, and hydrides thereof.

Among the resins for forming insulating layers, polyethylene terephthalate (PET), polyethylene naphthalate (PEN), and nylon are preferable from the perspectives of cost and heat resistance.

The resins for forming insulating layers may contain a filler from the perspectives of control of the elastic modulus and control of the thermal conductivity.

Examples of the filler to be added to a resin film include magnesium oxide, anhydrous magnesium carbonate, magnesium hydroxide, aluminum oxide, boron nitride, aluminum nitride, and silicon oxide. Among these, aluminum oxide, boron nitride, aluminum nitride, and silicon oxide are preferable from the perspectives of control of the elastic modulus, thermal conductivity, and the like.

The resins for forming insulating layers used for the insulating layers are preferably in a sheet-like form. The sheet-like form enables the insulating layers to be easily formed.

The inorganic materials are not particularly limited, and examples thereof include silicon oxide, aluminum oxide, magnesium oxide, calcium oxide, zirconium oxide, titanium oxide, boron oxide, hafnium oxide, barium oxide, boron nitride, aluminum nitride, and silicon carbide. Among these, silicon oxide and aluminum oxide are preferable from the perspectives of cost, stability, and availability.

A thickness of each of the insulating layers is preferably from 1 to 150 μm, more preferably from 2 to 140 μm, even more preferably from 3 to 120 μm, and particularly preferably from 5 to 100 μm. When the thickness of each of the insulating layers is within this range, the conductive portion of the thermal diffusion layers is less likely to penetrate the insulating layers, short circuiting with the chips of the thermoelectric conversion materials is suppressed, and the thermoelectric performance is maintained. The same applies to a case where the mounting surface of the thermoelectric conversion module has a conductive portion.

The volume resistivity of each of the insulating layers is preferably $1.0 \times 10^8$ Ω·cm or greater, more preferably $1.0 \times 10^9$ Ω·cm or greater, and still more preferably $1.0 \times 10^{10}$ Ω·cm or greater, from the perspective of ensuring the insulating property.

The volume resistivity is a value measured with a resistivity meter (MCP-HT450, available from Mitsubishi Chemical Analytech Co., Ltd.) after leaving the insulating layers in an environment of 23° C. and 50% RH for one day.

The insulating layers can be formed by a well-known method. For example, the insulating layers may be directly formed on the surfaces of the electrodes, or an insulating layer formed on a release sheet in advance may be bonded to each of the electrodes and transferred to the electrode by lamination. Two or more kinds of insulating layers may be layered.

(F) Thermal Diffusion Layer Forming Step

The method for manufacturing a thermoelectric conversion module according to the present invention preferably includes a thermal diffusion layer forming step. The thermal diffusion layer forming step is a step of laminating thermal diffusion layers on the upper and lower surfaces of the insulating layers obtained in step (E), and is, for example, a step of forming the thermal diffusion layers 7 on the upper and lower surfaces of the insulating layers 6 in (b) of FIG. 2 described above.

A thermal diffusion layer is provided on one side or both sides of the thermoelectric conversion module and functions as a heat dissipation layer. From the perspective of the thermoelectric performance, the thermal diffusion layer is preferably provided on both surfaces. By using the thermal diffusion layer in the present invention, for example, a sufficient temperature difference can be efficiently provided in the thickness direction to the chips of the thermoelectric conversion materials inside the thermoelectric conversion module.

Thermal Diffusion Layer

The thermal diffusion layer is formed from a material having high thermal conductivity. Examples of the material having high thermal conductivity used for the thermal diffusion layer include: a single metal such as copper, silver, iron, nickel, chromium, and aluminum; and an alloy such as stainless steel and brass. Among these, copper (including oxygen-free copper), stainless steel, and aluminum are preferable, and copper is more preferable because of its high thermal conductivity and easy processability.

Typical examples of the materials having high thermal conductivity used in the present invention are described below.

Oxygen-Free Copper

Oxygen-free copper (OFC) generally refers to high-purity copper of 99.95% (3N) or more that does not contain oxides. The Japanese Industrial Standards specifies oxygen-free copper (JIS H 3100, C1020) and oxygen-free copper for electronic tubes (JIS H3510, C1011).

Stainless steel (JIS)

SUS304: 18Cr-8Ni (containing 18% Cr and 8% Ni)

SUS316: 18Cr-12Ni (stainless steel containing 18% Cr, 12% Ni, and molybdenum (Mo))

The method for forming the thermal diffusion layer is not particularly limited, and examples thereof include a method for directly forming a pattern of the thermal diffusion layer by a screen printing method, an inkjet method, or the like.

Further examples include a method for processing a thermal diffusion layer formed from a material having high thermal conductivity having no pattern formed thereon obtained by dry processes including physical vapor deposition (PVD) methods, such as vacuum vapor deposition, sputtering, and ion plating or chemical vapor deposition (CVD) methods, such as thermal CVD and atomic layer deposition (ALD); or wet processes including various coating methods, such as dip coating, spin coating, spray coating, gravure coating, die coating, and doctor blade coating, and electrodeposition methods; silver salt methods; electrolytic plating; or electroless plating; or a rolled metal foil, an electrolytic metal foil, or the like into a predetermined pattern shape by a known physical treatment or chemical treatment based on photolithography or by using these treatments in combination.

The thermal conductivity of the thermal diffusion layer formed from the material having high thermal conductivity used in the present invention is preferably from 5 to 500 W/(m·K), more preferably from 8 to 500 W/(m·K), even more preferably from 10 to 450 W/(m·K), particularly preferably from 12 to 420 W/(m·K), and most preferably from 15 to 400 W/(m·K). When the thermal conductivity is in the above-described range, a temperature difference can be efficiently provided in the thickness direction of the thermoelectric conversion materials.

The thickness of the thermal diffusion layer is preferably from 40 to 550 μm, more preferably from 60 to 530 μm, and even more preferably from 80 to 510 μm.

Thermoelectric Conversion Module Cutting Step

The method for manufacturing a thermoelectric conversion module according to the present invention preferably includes a thermoelectric conversion module cutting step. The thermoelectric conversion module cutting step is, for example, a step of cutting the thermoelectric conversion module obtained in (e) of FIG. 1, (*a*) or (*b*) of FIG. 2, to obtain a plurality of thermoelectric conversion modules having predetermined specifications. The method for cutting the thermoelectric conversion module is not particularly limited, and a well-known method can be employed. For example, a method involving dicing may be used.

The dicing method is not particularly limited, and a well-known method such as blade dicing or laser dicing can be employed.

The method for manufacturing a thermoelectric conversion module according to the present invention eliminates the need for solder materials and supports used in known methods and allows collective and efficient production of a plurality of thin thermoelectric conversion modules through a simple method.

INDUSTRIAL APPLICABILITY

Since the method for manufacturing a thermoelectric conversion module according to the present invention can mass-manufacture thin and high-density thermoelectric conversion modules collectively, it is expected to provide inexpensive and downsized thermoelectric conversion modules.

REFERENCE SIGNS LIST

1: Support
2*p*: Chip of P-type thermoelectric conversion material
2*n*: Chip of N-type thermoelectric conversion material
3: Insulator
3': Insulator excess portion
4*a*: Integrated body (with insulator excess portion)
4*b*: Integrated body (after removal of insulator excess portion)
5: Electrode
6: Insulating layer
7: Thermal diffusion layer

The invention claimed is:

1. A method for manufacturing a thermoelectric conversion module, the method comprising the following steps (A) to (D):
   (A) disposing a chip of a P-type thermoelectric conversion material and a chip of an N-type thermoelectric conversion material on a support so as to be spaced apart from each other;
   (B) filling an insulator between the chip of the P-type thermoelectric conversion material and the chip of the N-type thermoelectric conversion material to obtain an integrated body including the chip of the P-type thermoelectric conversion material, the chip of the N-type thermoelectric conversion material, and the insulator;
   (C) peeling the integrated body obtained in step (B) from the support; and
   (D) connecting the chip of the P-type thermoelectric conversion material and the chip of the N-type thermoelectric conversion material via an electrode in the integrated body after step (C).

2. The method for manufacturing a thermoelectric conversion module according to claim 1, further comprising the following step (B') after step (B) and before step (C):
   (B') removing an excess portion of the insulator that is in direct contact with at least regions on upper surfaces of the chip of the P-type thermoelectric conversion material and the chip of the N-type thermoelectric conversion material in the integrated body obtained in step (B).

3. The method for manufacturing a thermoelectric conversion module according to claim 1, comprising the following step (E) after step (D):

(E) laminating an insulating layer on the electrode.

4. The method for manufacturing a thermoelectric conversion module according to claim 3, further comprising the following step (F) after step (E):

(F) laminating a thermal diffusion layer on the insulating layer.

5. The method for manufacturing a thermoelectric conversion module according to claim 1, wherein the insulator is selected from an insulating resin and ceramic.

6. The method for manufacturing a thermoelectric conversion module according to claim 5, wherein the insulating resin is selected from a polyimide-based resin, a silicone-based resin, a rubber-based resin, an acrylic resin, an olefin-based resin, a maleimide-based resin, and an epoxy-based resin.

7. The method for manufacturing a thermoelectric conversion module according to claim 1, wherein a fixing layer is included between the support and the chip of the P-type thermoelectric conversion material and the chip of the N-type thermoelectric conversion material.

8. The method for manufacturing a thermoelectric conversion module according to claim 7, wherein the fixing layer is formed from a pressure sensitive adhesive layer.

9. The method for manufacturing a thermoelectric conversion module according to claim 1, wherein the support is selected from glass, plastic, and silicon.

10. The method for manufacturing a thermoelectric conversion module according to claim 1, wherein the chip of the P-type thermoelectric conversion material and the chip of the N-type thermoelectric conversion material are formed from a thermoelectric semiconductor composition.

11. The method for manufacturing a thermoelectric conversion module according to claim 10, wherein the thermoelectric semiconductor composition includes a thermoelectric semiconductor material, a heat-resistant resin, and one or both of an ionic liquid and an inorganic ionic compound.

* * * * *